United States Patent
Ogawa et al.

(10) Patent No.: US 8,085,081 B2
(45) Date of Patent: Dec. 27, 2011

(54) SEMICONDUCTOR DEVICE FOR OUTPUT OF PULSE WAVEFORMS

(75) Inventors: Hirofumi Ogawa, Tokyo (JP); Daisuke Fujii, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/724,443

(22) Filed: Mar. 16, 2010

(65) Prior Publication Data

US 2010/0244930 A1 Sep. 30, 2010

(30) Foreign Application Priority Data

Mar. 27, 2009 (JP) ................. 2009-079769

(51) Int. Cl.
*H03K 17/296* (2006.01)
(52) U.S. Cl. ............. 327/393; 327/108; 326/85; 326/87
(58) Field of Classification Search .......... 327/108–109, 327/111–112, 379–381, 391, 393, 394; 326/82–83, 326/85, 87–88
See application file for complete search history.

(56) References Cited

U.S. PATENT DOCUMENTS

| 6,232,814 | B1 * | 5/2001 | Douglas, III | 327/281 |
| 6,366,129 | B1 * | 4/2002 | Douglas et al. | 326/86 |
| 6,373,300 | B2 * | 4/2002 | Welch et al. | 327/112 |
| 6,879,205 | B2 * | 4/2005 | Courau | 327/391 |

FOREIGN PATENT DOCUMENTS

JP 2002-057566 2/2002

* cited by examiner

*Primary Examiner* — An Luu
(74) *Attorney, Agent, or Firm* — Volentine & Whitt, PLLC

(57) ABSTRACT

A semiconductor device has multiple high-side field-effect transistors and multiple low-side field-effect transistors connected to a single output terminal to generate an output signal. A driver circuit outputs driving signals that turn the field-effect transistors on and off. The driving signal for the field-effect transistors on each side is conducted by a salicided gate line with salicide block areas that produce successive delays, causing the field-effect transistors to turn on sequentially. Alternatively, the transistors have different threshold voltages, or the driving signals for different transistors are output from drivers with different driving abilities, again causing the transistors to turn on sequentially. The output signal therefore rises and falls gradually, reducing electromagnetic interference.

14 Claims, 10 Drawing Sheets

SEMICONDUCTOR DEVICE FOR OUTPUT OF PULSE WAVEFORMS

BACKGROUND OF THE INVENTION

1. Field of the Invention

The present invention relates to a semiconductor device, more particularly to a semiconductor device that outputs a pulse waveform with reduced electromagnetic interference.

2. Description of the Related Art

Semiconductor devices need to be able to operate without producing excessive electromagnetic interference (EMI), and at the same time their electromagnetic susceptibility (EMS), that is their tendency to malfunction in the presence of external electromagnetic interference, needs to be low. A known output buffer circuit (see Japanese Patent Application Publication No. 2002-57566) meets these conflicting requirements by adding a control circuit to a bi-level output circuit. The bi-level output circuit outputs a signal having a pulse waveform with a high voltage level and a low voltage level. The control circuit reduces the driving ability of the bi-level output circuit during transitions of the output signal between these two levels, as compared with the driving ability when the output signal is being maintained at one level or the other.

The addition of the control circuit, however, makes this output buffer circuit problematically complex. Specifically, the control circuit must detect signal transitions and output various driving signals with different timings.

SUMMARY OF THE INVENTION

An object of the present invention is to provide a semiconductor device that has a simple circuit configuration but can output a pulse waveform with reduced electromagnetic interference.

The invention provides a semiconductor device having an output terminal and at least one series circuit including a high-side field-effect transistor and a low-side field-effect transistor with respective first main terminals interconnected at a node connected to the output terminal. The high-side field-effect transistor has a second main terminal connected to a power supply. The low-side field-effect transistor has a second main terminal connected to ground. The high-side and low-side field-effect transistors have respective control terminals by which they are turned on and off to produce an output signal at the output terminal.

In some embodiments, the semiconductor device includes a plurality of such series circuits and a driver circuit that outputs driving signals to the control terminals of the high-side and low-side field-effect transistors to turn the high-side field-effect transistors on sequentially, at different timings, to turn the low-side field-effect transistors on sequentially, at different timings.

The driver circuit may include a first driver that outputs a first driving signal on a first signal line to the control terminals of all the high-side field-effect transistors, and a second driver that outputs a second driving signal on a second signal line to the control terminals of all the low-side field-effect transistors. The first and second signal lines are salicided signal lines with salicide block areas disposed between the control terminals of the field-effect transistors. The salicide block areas delay the first and second driving signals, causing the field-effect transistors in different series circuits to turn on at different timings.

Alternatively, the high-side field-effect transistors may have different threshold voltages, causing them to turn on at different timings, and the low-side field-effect transistors may have different threshold voltages, causing them to turn on at different timings.

Alternatively, the control terminal of each high-side field-effect transistor may be connected to a separate driver in the driver circuit and these drivers may have different driving abilities, causing the high-side field-effect transistors to turn on at different timings. Similarly, the control terminal of each low-side field-effect transistor may be connected to a separate driver in the driver circuit and these drivers may also have different driving abilities, causing the low-side field-effect transistors to turn on at different timings.

In these embodiments, transitions in the level of the output signal take place gradually because the high-side or low-side field-effect transistors turn on sequentially instead of all at once.

In some other embodiments, the semiconductor circuit includes just one series circuit as described above, and includes a first driver, a first capacitor, a first switching element connected to the first capacitor, a second driver, a second capacitor, a second switching element connected to the second capacitor, and a switching control circuit that controls the first and second switching elements.

The first driver outputs a first driving signal to the control terminal of the high-side field-effect transistor and a first auxiliary signal to the first capacitor. When the first driving signal is output at a level that turns the high-side field-effect transistor on, the first auxiliary signal is output at the same level, and the switching control circuit turns the first switching element off. When the first driving signal is output at a level that turns the high-side field-effect transistor off, the first auxiliary signal is placed in a high-impedance state, and the switching control circuit turns the first switching element on to charge or discharge the first capacitor.

The second driver outputs a second driving signal to the control terminal of the low-side field-effect transistor and a second auxiliary signal to the second capacitor. When the second driving signal is output at a level that turns the low-side field-effect transistor on, the second auxiliary signal is output at the same level, and the switching control circuit turns the second switching element off. When the second driving signal is output at a level that turns the low-side field-effect transistor off, the second auxiliary signal is placed in a high-impedance state, and the switching control circuit turns the second switching element on to discharge the second capacitor.

In these embodiments, the high-side and low-side field-effect transistors turn on slowly because while turning them on, the first and second drivers must also charge or discharge the first and second capacitors. Transitions in the level of the output signal therefore take place gradually.

In all embodiments, the gradual transitions of the output signal reduce electromagnetic interference. All embodiments have a simple circuit structure because there is no need to detect signal transitions or vary the timing of the driving signals.

DETAILED DESCRIPTION OF THE INVENTION

Figure 1:
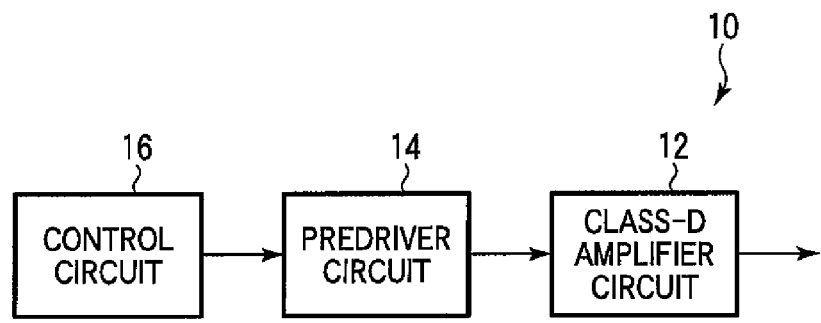
FIG. 1 is a simplified block diagram illustrating a semiconductor device according to a first embodiment of the invention.

Embodiments of the invention will now be described with reference to the attached drawings, in which like elements are indicated by like reference characters. The field-effect transistors are metal-oxide-semiconductor field-effect transistors (MOSFETs). P-channel MOSFETs will be referred to as P-MOSFETs, and N-channel MOSFETs as N-MOSFETs. The main terminals of these MOSFETs will be referred to as their source and drain terminals, and their control terminals will be referred to as gate electrodes. Repeated descriptions of like elements will be omitted as appropriate.

First Embodiment

Referring to FIG. 1, the semiconductor device 10 in the first embodiment includes a class-D amplifier circuit 12 that outputs a signal with a pulse waveform, a driver circuit referred to as a predriver circuit 14 that drives the class-D amplifier circuit 12 by turning its MOSFETs on and off, and a control circuit 16 that controls the predriver circuit 14.

Figure 2:
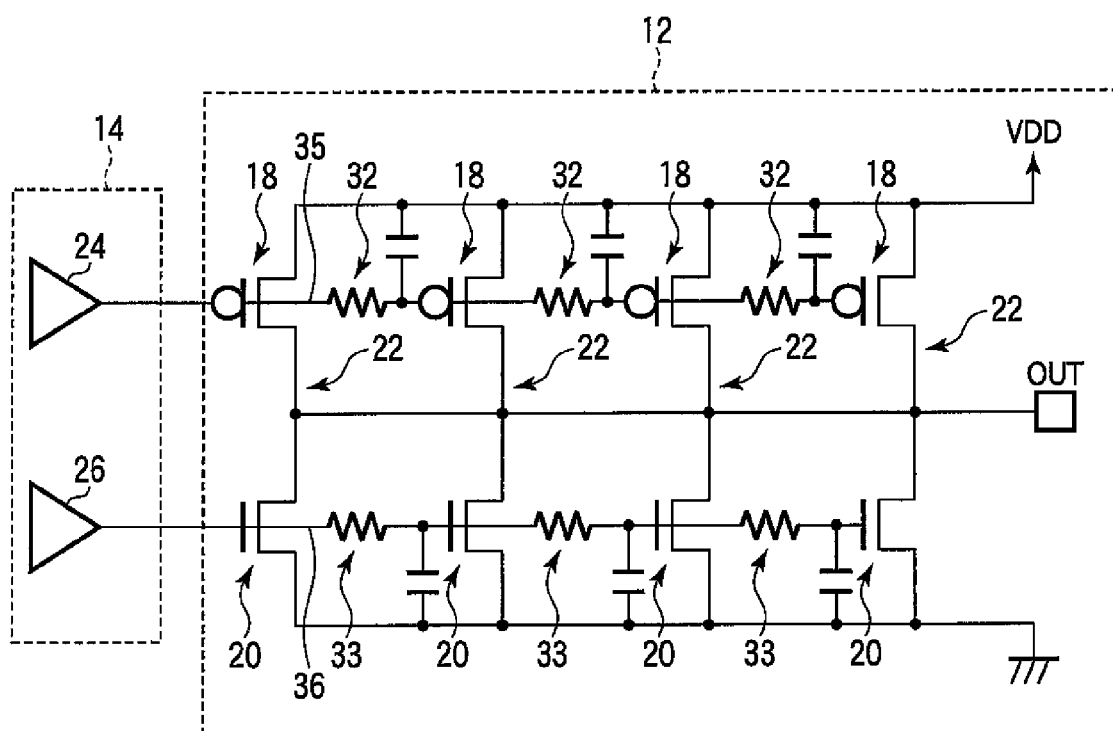
FIG. 2 is a circuit diagram of the predriver circuit and class-D amplifier circuit in FIG. 1.

Referring to FIG. 2, the class-D amplifier circuit 12 includes a plurality of P-MOSFETs 18 and a plurality of N-MOSFETs 20 interconnected by their drain terminals to form a plurality of series circuits, each consisting of one P-MOSFET 18 and one N-MOSFET 20 interconnected to operate as an inverter circuit 22. The gate electrode of the P-MOSFET 18 in the first-stage inverter circuit 22, i.e., the inverter circuit 22 closest to the predriver circuit 14, is connected to the output terminal of a first driver referred to as a first predriver 24 in the predriver circuit 14. The gate electrode of the N-MOSFET 20 in the first-stage inverter circuit 22 is connected to the output terminal of a second driver referred to as a second predriver 26 in the predriver circuit 14.

The gate electrodes of each pair of mutually adjacent P-MOSFETs 18 are interconnected by a salicided signal line 35, and the gate electrodes of each pair of mutually adjacent N-MOSFETs 20 are likewise interconnected by a salicided signal line 36. The gate electrodes and salicided signal lines are well known doped polysilicon structures including a compound silicon-metal layer referred to as a salicide layer that provides reduced electrical resistance.

The source terminal of each P-MOSFET 18 is connected to the power supply (VDD). The source terminal of each N-MOSFET 20 is connected to ground.

Figure 3:
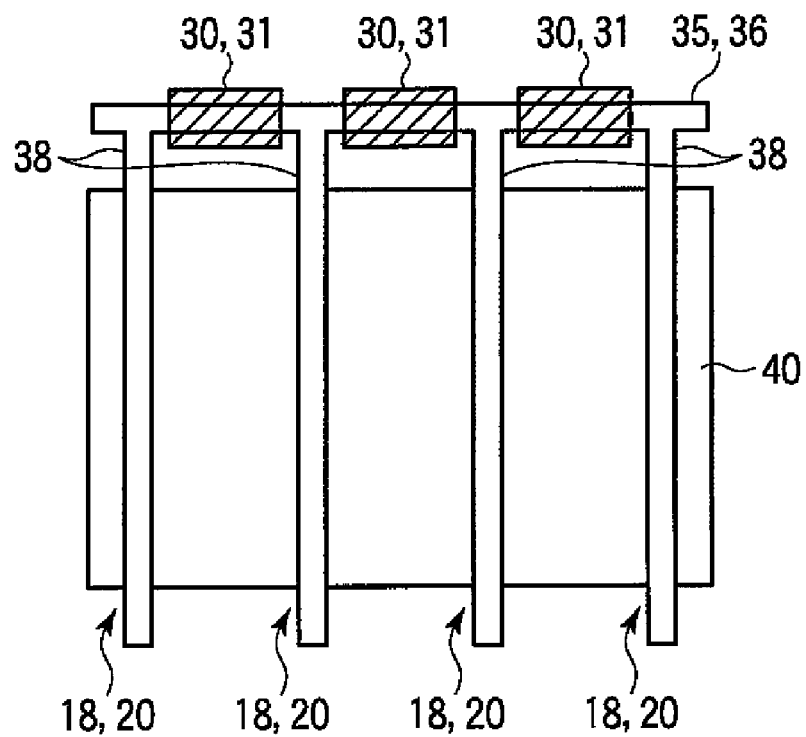
FIG. 3 is a simplified plan view of transistor gate interconnections with salicide block areas.

Referring to FIG. 3, a salicide block area 30 is formed on the salicided signal line 35 interconnecting the gate electrodes 38 of each pair of mutually adjacent P-MOSFETs 18. The salicided signal line 35 and salicide block areas 30 are disposed on one side of the active area 40 in which the P-MOSFETs 18 are formed. The gate electrodes 38 of the P-MOSFETs 18 extend as stubs from the salicided signal line 35. No salicide layer is formed in the salicide block area 30, so the parts of the signal line 35 where the salicide block areas 30 are formed have higher electrical resistance than other parts of the signal line 35. The salicide block areas 30 are accordingly equivalent to resistance elements 32 disposed between the gate electrodes of each pair of mutually adjacent P-MOSFETs 18 as shown in FIG. 2.

As also indicated in FIG. 3, a salicide block area 31 is formed on the salicided signal line 36 interconnecting the gate electrodes of each pair of mutually adjacent N-MOSFETs 20. These salicide block areas 31 are equivalent to resistance elements 33 disposed between the gate electrodes of mutually adjacent N-MOSFETs 20 as shown in FIG. 2.

An output signal is output from an output terminal (OUT) connected to the nodes at which the drain terminals of the P- and N-MOSFETs 18, 20 in each inverter circuit 22 are interconnected.

The first predriver 24 in the predriver circuit 14 in FIG. 2 includes an inverter circuit that outputs a first driving signal to turn the P-MOSFETs 18 on and off responsive to a control signal (shown in FIG. 1) from the control circuit 16. Similarly, the second predriver 26 includes an inverter circuit that outputs a second driving signal to turn the N-MOSFETs 20 on and off responsive to the control signal from the control circuit 16. The first and second driving signals are bi-level signals and are output at the VDD and ground voltage levels, referred to below as the high and low levels, respectively. The first and second driving signals are both output at the same level and have pulse-like waveforms with abrupt transitions.

Starting from a state in which the first and second driving signals are both high, the P-MOSFETs 18 are turned off, the N-MOSFETs 20 are turned on, and the output signal is at the ground level, the first embodiment operates as follows.

First, the control circuit 16 outputs a control signal that changes the first and second driving signals abruptly to the low level.

When the first driving signal output from the first predriver 24 abruptly goes low, the P-MOSFET 18 in the first-stage inverter circuit 22 of the class-D amplifier circuit 12 promptly turns on. The first driving signal also propagates to the gate electrode of the P-MOSFET 18 in the second-stage inverter circuit 22, but with a delay due to the intervening resistance element 32 and the parasitic capacitance of the gate electrode of the first-stage P-MOSFET 18, indicated by a capacitor symbol in FIG. 2. The second-stage P-MOSFET 18 turns on with a corresponding delay.

The delayed first driving signal then reaches the gate electrode of the P-MOSFET 18 in the third-stage inverter circuit 22 with a further delay due to the next resistance element 32 and the parasitic gate capacitance of the second-stage P-MOSFET 18, and the third-stage P-MOSFET 18 turns on with a corresponding further delay. Finally, the first driving signal propagates with a still further delay, due to the next resistance element 32 and the parasitic gate capacitance of the third-stage P-MOSFET 18, and the fourth-stage P-MOSFET 18 turns on with a corresponding delay.

When the second driving signal output from the second predriver 26 abruptly goes low it promptly turns off the N-MOSFET 20 in the first-stage inverter circuit 22 of the class-D amplifier circuit 12. The second driving signal is then similarly delayed by resistance elements 33 and the parasitic gate capacitance of the N-MOSFETs 20, causing the N-MOSFETs 20 in the subsequent stages to turn off with corresponding successive delays.

Figure 4:
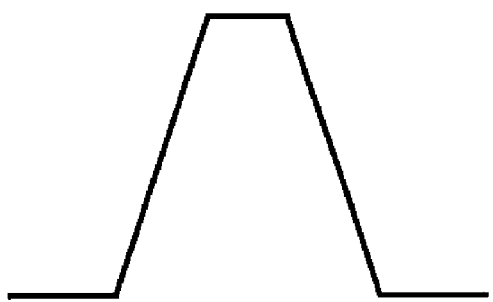
FIG. 4 illustrates a pulse waveform output from the class-D amplifier circuit.

Although each P-MOSFET 18 can conduct only a limited amount of current, as the P-MOSFETs 18 turn on in sequence they supply an increasing amount of current from the power supply (VDD), and as the N-MOSFETs 20 turn off in sequence, this current is increasingly directed to the output terminal OUT instead of being shunted to ground. The waveform of the output signal therefore rises gradually from the ground level (low) to the VDD level (high) as shown in FIG. 4, with a transition time determined in part by the parasitic gate capacitance of the MOSFETs and in part by the salicide block areas 30, 31.

Conversely, when the driving signals output from the first and second predrivers 24, 26 go high, the P-MOSFETs 18 turn off and the N-MOSFETs 20 turn on with successive delays, and current flows from the output terminal OUT to ground, pulling the output signal down to the low level. Because each N-MOSFET 20 conducts a limited amount of current, the waveform of the output signal falls gradually from the high level to the low level with a transition time as shown in FIG. 4.

Although the semiconductor device in the first embodiment has a simple circuit configuration with a particularly simple predriver circuit 14, it can prolong the rise and fall times of the output signal by turning the P-MOSFETs 18 and N-MOSFETs 20 in the inverter circuits 22 on and off sequentially, causing the output waveform to make slow transitions and thereby reducing electromagnetic interference. This effect is achieved without an increase in electromagnetic susceptibility because after the transition times, the multiple P-MOSFETs 18 or multiple N-MOSFETs 20 are all turned on and provide adequate driving ability to hold the output signal at the desired level.

Figure 5:
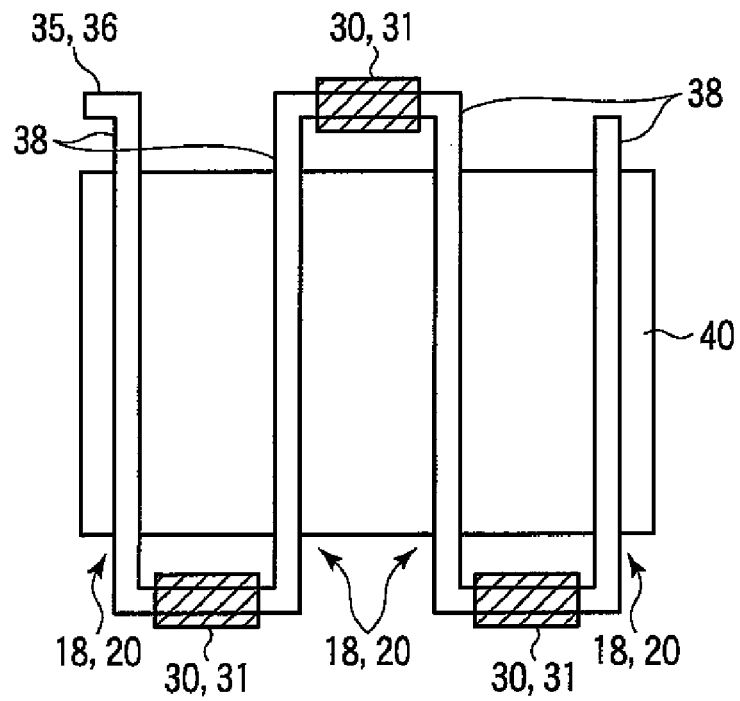
FIG. 5 is another simplified plan view of transistor gate interconnections with salicide block areas.

The salicide block areas 30 or 31 need not be aligned on one side of the active MOSFET area 40 as shown in FIG. 3. The gate interconnections may be placed on alternate sides of the active MOSFET area 40 as shown in FIG. 5, and the salicide block areas 30 or 31 may be likewise placed on alternate sides of the active MOSFET area, so that the salicide block areas 30 or 31 are in series with the gate electrodes 38. By forcing the driving signals from the predrivers to propagate through the gate electrodes, this scheme provides slightly greater delays.

Second Embodiment

The second embodiment differs from the first embodiment mainly in having switching elements connected in parallel with the resistance elements formed by the salicide blocks.

Figure 6:
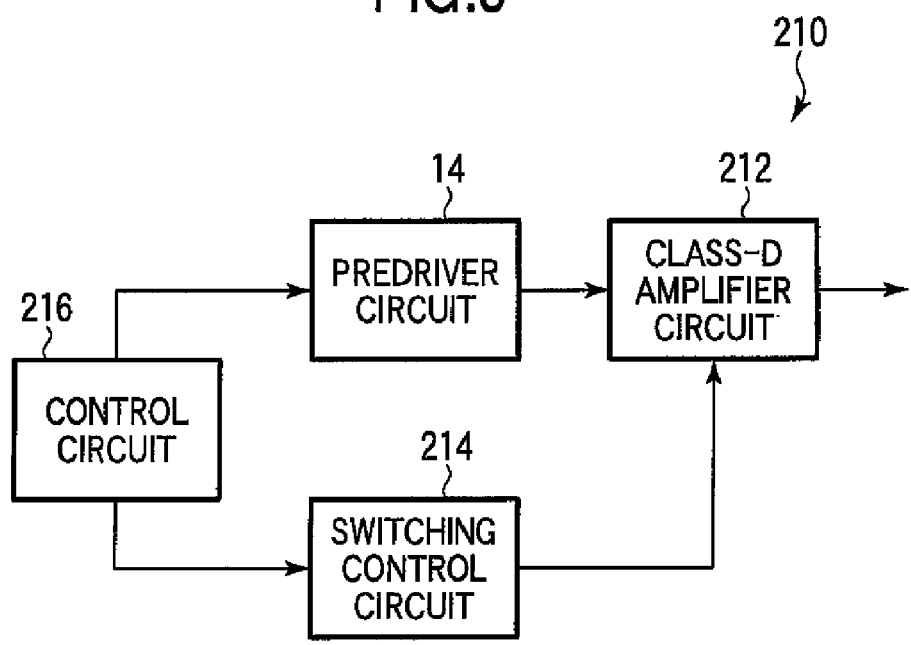
FIG. 6 is a simplified block diagram illustrating a semiconductor device according to a second embodiment of the invention.

Referring to FIG. 6, the semiconductor device 210 in the second embodiment includes a class-D amplifier circuit 212 that outputs a signal with a pulse waveform, the predriver circuit 14 described in the first embodiment, a programmable switching control circuit 214 that turns switching elements in the class-D amplifier circuit 212 on and off, and a control circuit 216 that controls the predriver circuit 14 and the switching control circuit 214.

Figure 7:
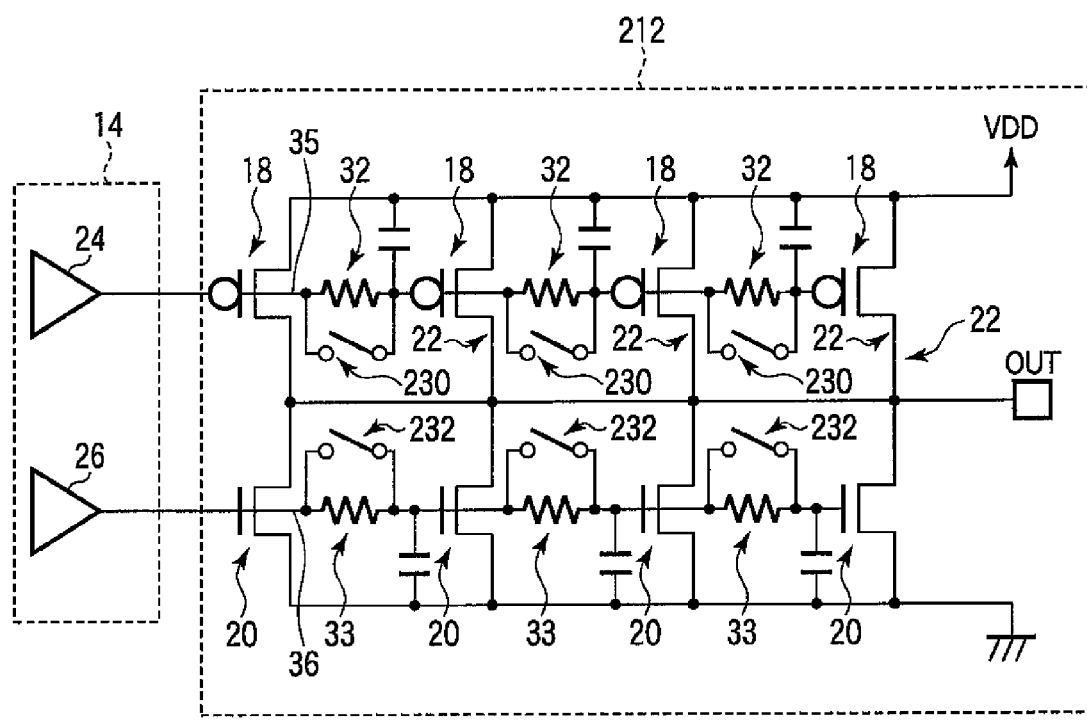
FIG. 7 is a circuit diagram of the predriver circuit and class-D amplifier circuit in FIG. 6.

Referring to FIG. 7, the class-D amplifier circuit 212 includes a plurality of series circuits comprising P-MOSFETs 18 and N-MOSFETs 20 interconnected to operate as inverter circuits 22 as in the first embodiment, with salicide block areas 30, 31 equivalent to resistance elements 32, 33 formed on the salicided signal lines 35, 36 interconnecting the gate electrodes of mutually adjacent P-MOSFETs 18 and mutually adjacent N-MOSFETs 20. The salicide block areas 30, 31 may be formed as shown in either FIG. 3 or FIG. 5.

First switching elements 230 are connected in parallel with the resistance elements 32 formed on the P-MOSFET gate interconnection line 35. Each first switching element 230 thus bridges one of the salicide block areas 30 formed on the salicided signal line interconnecting the gate electrodes of a pair of mutually adjacent P-MOSFETs 18.

Similarly, second switching elements 232 are connected in parallel with the resistance elements 33 formed on the N-MOSFET gate interconnection line 36. Each second switching element 232 bridges one of the salicide block areas 31 formed on the salicided signal line interconnecting the gate electrodes of a pair of mutually adjacent N-MOSFETs 20.

Figure 8:
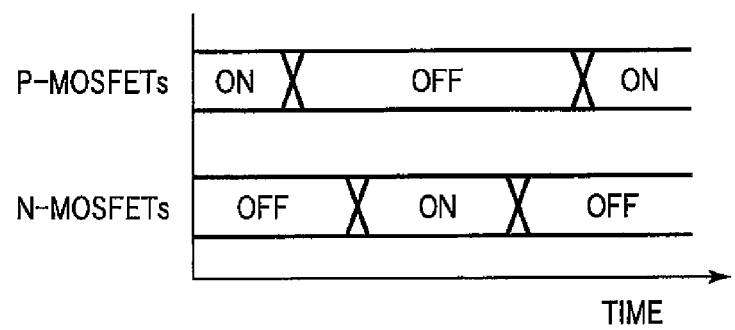
FIG. 8 is a timing diagram illustrating the on-off switching of the MOSFETs in FIG. 7.

In order to reduce current flowing from the power supply VDD to ground through the P-MOSFETs 18 and N-MOSFETs 20, the first and second predrivers 24, 26 in the predriver circuit 14 output high and low level driving signals such that none of the P-MOSFETs 18 are turned on until all the N-MOSFETs 20 are turned off and none of the N-MOSFETs 20 are turned on until all the P-MOSFETs 18 are turned off, as shown in FIG. 8.

When the P-MOSFETs 18 are turned on, the switching control circuit 214 turns off a programmable number of first switching elements 230, corresponding to a desired output transition time, and leave the remaining first switching elements 230 turned on. When the P-MOSFETs 18 are turned off, the switching control circuit 214 turns on all the first switching elements 230.

When the P-MOSFETs 18 are turned on, the maximum output transition time is obtained if all the first switching elements 230 are turned off. As the number of first switching elements 230 that are turned off is reduced, the output transition time becomes shorter. The minimum output transition time is obtained if none of the first switching elements 230 are turned off.

The output transition time when the N-MOSFETs 20 are turned on is similarly controlled by programming the switching control circuit 214 to turn off a desired number of second switching elements 232. The programming can be performed by well known software or hardware methods, a description of which will be omitted.

Other aspects of the structure and operation of the semiconductor device 210 in the second embodiment are as described in the first embodiment, so further description will be omitted.

A particular feature of the second embodiment is that the P-MOSFETs and N-MOSFETs in the inverter circuits are turned off with minimum delay, thereby minimizing the standby time before the turning on of the N-MOSFETs or P-MOSFETs begins. This feature enables high-speed on/off switching of the output signal despite the intentionally slowed transitions of the output waveform and the staggering of the predriver output signals.

As in the first embodiment, the slow transitions of the output waveform reduce electromagnetic interference. In addition, the transition times of the output waveform are programmable and can be tailored to the needs of the specific system in which the class-D amplifier circuit is used by changing the number of switching elements that are turned on at the transitions of the output signal.

The first and second embodiments described above can be modified by replacing the P-MOSFETs with N-MOSFETs, so that the class-D amplifier circuit includes a plurality of series circuits, each including a pair of N-MOSFETs connected in series. The first predriver may then include a bootstrap circuit to generate gate voltages for the N-MOSFETs on the high side.

Third Embodiment

The third embodiment has the basic configuration shown in FIG. 6, but differs from the second embodiment in that the switching elements in the class-D amplifier circuit connect the gate electrodes of the P-MOSFETs to the power supply and the gate electrodes of the N-MOSFETs to ground.

Figure 9:
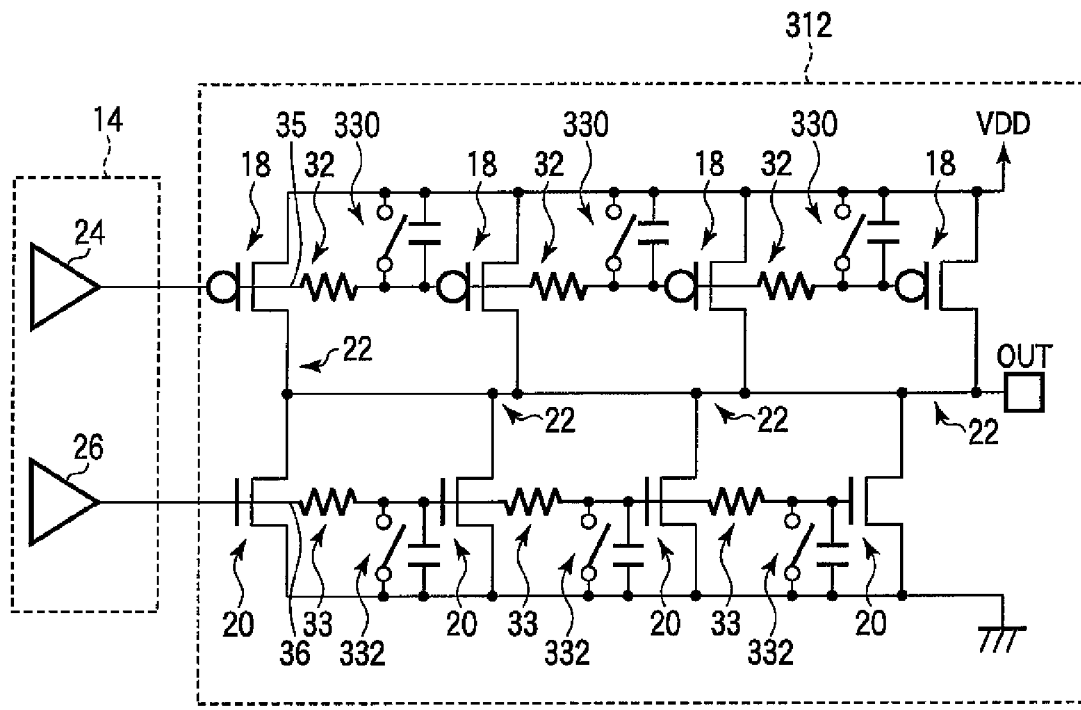
FIG. 9 is a circuit diagram of the predriver circuit and class-D amplifier circuit in a third embodiment of the invention.

Referring to FIG. 9, the class-D amplifier circuit 312 in the third embodiment includes P-MOSFETs 18 and N-MOSFETs 20 interconnected to form inverter circuits 22 as in the first embodiment, with salicide block areas equivalent to resistance elements 32, 33 formed on the gate interconnection signal lines 35, 36.

The class-D amplifier circuit 312 also includes a plurality of first switching elements 330 and a plurality of second switching element 332. The first switching elements 330 have first terminals connected to nodes between the resistance elements 32 and the gate electrodes of the P-MOSFETs 18, and second terminals connected to the power supply VDD. The second switching element 332 have first terminals connected to nodes between the resistance elements 33 and the gate electrodes of the N-MOSFETs 20, and second terminals connected to ground.

The first and second predrivers 24, 26 in the predriver circuit 14 output respective driving signals with the staggered timing shown in FIG. 8.

When the P-MOSFETs 18 are turned on, the switching control circuit 214 turns all the first switching elements 330 off and the low level driving signal from the first predriver 24 propagates to the gate electrode of the P-MOSFETs 18 with successive delays due to the resistance elements 32 and the parasitic gate capacitances of the P-MOSFETs 18. When the P-MOSFETs 18 are turned off, the switching control circuit 214 turns all the first switching elements 330 on, connecting the gate electrodes of the P-MOSFETs 18 to the power supply VDD.

Similarly, the switching control circuit 214 turns the second switching elements 332 on when the N-MOSFETs 20 are turned off, and off when the N-MOSFETs 20 are turned on. When turned on, the second switching elements 332 ground the gate electrodes of the N-MOSFETs 20.

Other aspects of the structure and operation of the third embodiment are as described in the first embodiment, so further description will be omitted.

As in the first embodiment, when turning the P-MOSFETs and N-MOSFETs on, the semiconductor device in the third embodiment prolongs the transition times of the output signal waveform by delaying the propagation of the gate driving signal so that the MOSFETs turn on sequentially, causing the output signal to make slow transitions that reduce electromagnetic interference.

When the P-MOSFETs or N-MOSFETs are turned off, however, they turn off promptly, in unison, because their gate electrodes receive the power supply or ground voltage directly through the switching elements, instead of having to wait for the gate driving signal to propagate through the resistance elements. As described in the second embodiment, this enables high-speed on/off switching of the output signal despite the intentionally slowed transitions of the output waveform and the staggering of the predriver output signals.

Fourth Embodiment

The fourth embodiment differs from the third embodiment in that the high-side field-effect transistors are N-MOSFETs, and the first switching elements are connected to the output terminal instead of the power supply.

Figure 10:
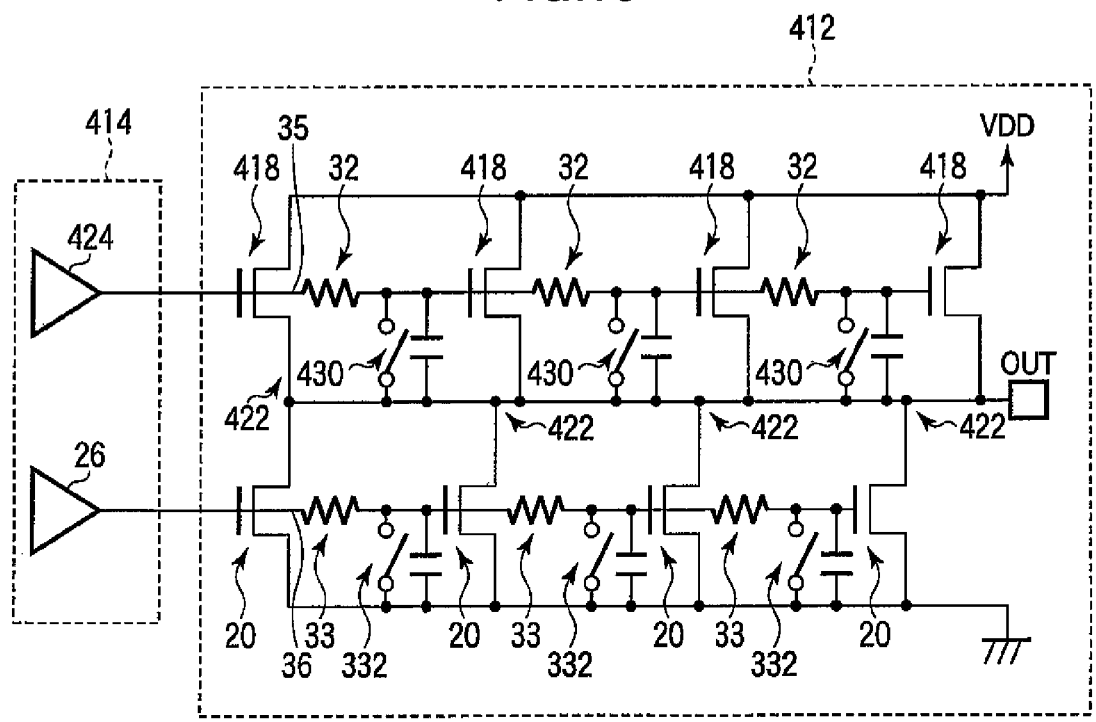
FIG. 10 is a circuit diagram of the predriver circuit and class-D amplifier circuit in a fourth embodiment.

Referring to FIG. 10, the class-D amplifier circuit 412 in the fourth embodiment includes a plurality of high-side N-MOSFETs 418 connected in series with the low-side N-MOSFETs 20 to form a plurality of series circuits 422, each consisting of one high-side N-MOSFET 418 and one low-side N-MOSFET 20. The gate electrode of the high-side N-MOSFET 418 in the first-stage series circuit 422 is connected to the output terminal of a first predriver 424 in a predriver circuit 414. The gate electrode of the low-side N-MOSFET 20 in the first-stage series circuit 422 is connected to the output terminal of a second predriver 26 in the predriver circuit 414. The gate electrodes of the high-side N-MOSFETs 418 are interconnected by a salicided signal line 35, and the gate electrodes of the low-side N-MOSFETs 20 are interconnected by a salicided signal line 36. The drain terminals of the high-side N-MOSFETs 418 are connected to the power supply VDD and the source terminals of the low-side N-MOSFETs 20 are connected to ground.

Salicide block areas equivalent to resistance elements 32 are formed on salicided signal line 35 between the gate electrodes of each pair of mutually adjacent high-side N-MOSFETs 418. Similarly, salicide block areas equivalent to resistance elements 33 are formed on salicided signal line 36 between the gate electrodes of each pair of mutually adjacent low-side N-MOSFETs 20.

The class-D amplifier circuit 412 also includes a plurality of first switching elements 430 and a plurality of second switching elements 332. Differing from the third embodiment, the first switching elements 430 have first terminals connected to nodes at which resistance elements 32 and the gate electrodes of the high-side N-MOSFETs 418 are interconnected, and second terminals connected to nodes at which the high-side N-MOSFETs 418, low-side N-MOSFETs 20, and output terminal OUT are interconnected. The second switching elements 332 have first terminals connected to nodes at which resistance elements 33 and the gate electrodes of the low-side N-MOSFETs 20 are interconnected, and second terminals connected to ground, as in the third embodiment.

The first predriver 424 in the predriver circuit 414 may include a well known bootstrap circuit (not shown) that generates a gate voltage for the high-side N-MOSFETs 418.

In order to reduce current flowing from the power supply VDD to ground through the N-MOSFETs 418, 20, the predriver circuit 414 is controlled to output driving signals that turn the high-side N-MOSFETs 418 on only after the low-side N-MOSFETs 20 are all turned off, and turn the low-side N-MOSFETs 20 on only after the high-side N-MOSFETs 418 are all turned off.

To turn on the high-side N-MOSFETs 418, the first predriver 424 outputs a high level driving signal, and the switching control circuit 214 turns off all the first switching elements 430. The driving signal propagates to the gate electrodes of the high-side N-MOSFETs 418 with successive delays due to the resistance elements 32 and the gate parasitic capacitances of these N-MOSFETs 418.

To turn off the high-side N-MOSFETs 418, the first predriver 424 outputs a low level driving signal, and the switching control circuit 214 turns on all the first switching elements 430. The first-stage high-side N-MOSFET 418 turns off promptly in response to the low level driving signal. The second-, third-, and four-stage high-side N-MOSFETs 418 turn off promptly because their source and gate potentials are equalized.

After the high-side N-MOSFETs 418 are turned off, the second pre-driver 26 turns on the low-side N-MOSFETs, and the source and gate potentials of the second-, third-, and four-stage high-side N-MOSFETs 418 are pulled down to the ground level together with the output signal.

When the low-side N-MOSFETs 20 are turned on and off, the switching control circuit 214 controls the second switching elements 332 as described in the third embodiment.

Other aspects of the structure and operation of the fourth embodiment are as described in the first embodiment, so further description will be omitted.

The fourth embodiment reduces electromagnetic interference by turning both the high-side and low-side N-MOSFETs on with successive delays, so that the output signal makes slow transitions.

The fourth embodiment also enables high-speed on/off switching of the output signal by turning off both the high-side and low-side N-MOSFETs promptly, without successive delays.

Fifth Embodiment

The output circuit in the fifth embodiment has the general configuration shown in FIG. 6, including a switching control circuit 214 and control circuit 216, but the class-D amplifier circuit in the fifth embodiment includes only one series circuit, and capacitors are used to slow the transitions of the output signal.

Figure 11:
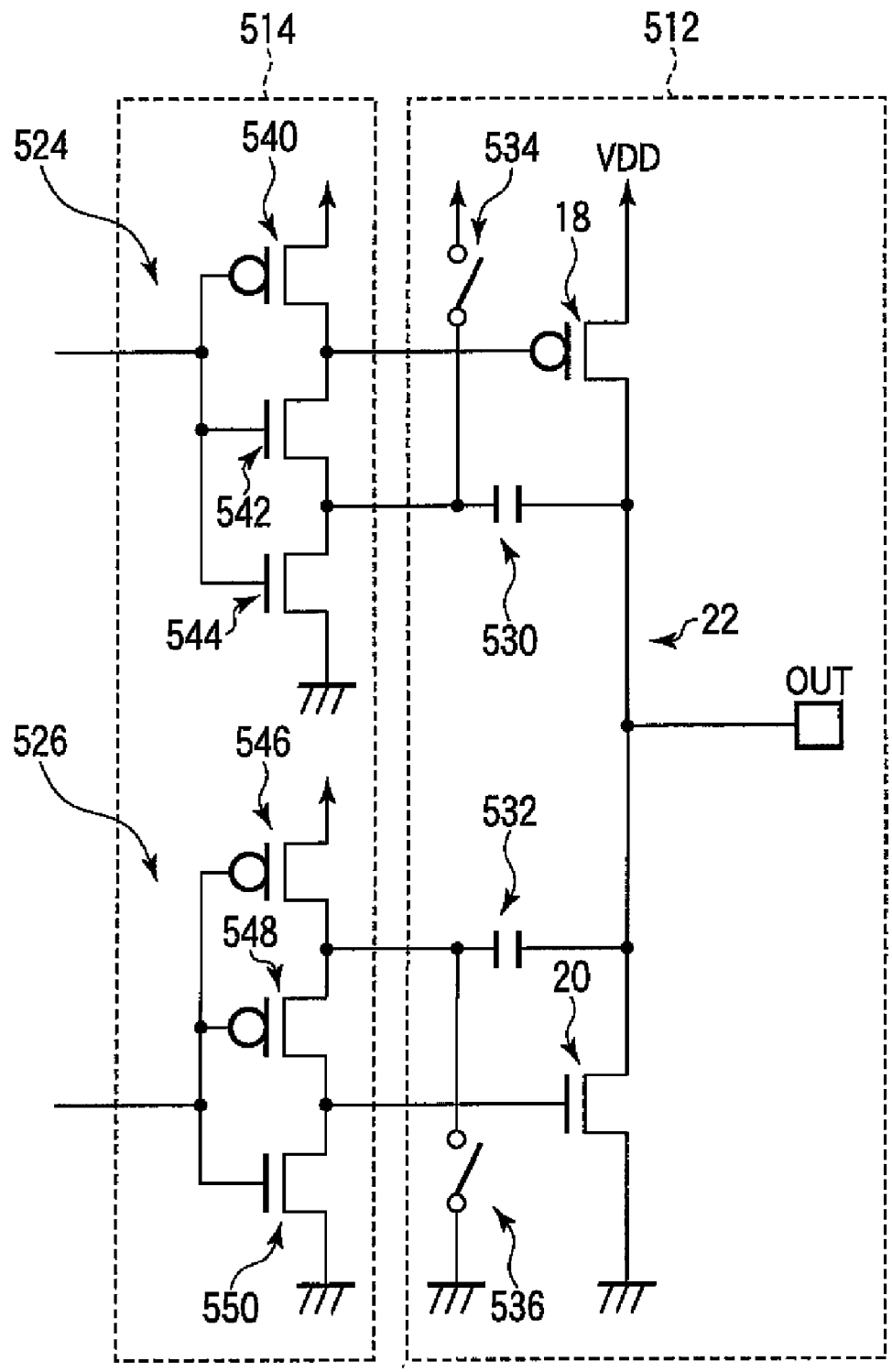
FIG. 11 is a circuit diagram of the predriver circuit and class-D amplifier circuit in a fifth embodiment.

Referring to FIG. 11, the class-D amplifier circuit 512 in the fifth embodiment includes one P-MOSFET 18 connected in series with one N-MOSFET 20 to form one inverter circuit 22. The gate electrode of the P-MOSFET 18 in the inverter circuit 22 is connected to a first predriver 524 in the predriver circuit 514. The gate electrode of the N-MOSFET 20 in the inverter circuit 22 is connected to a second predriver 526 in the predriver circuit 514.

The class-D amplifier circuit 512 further includes first and second capacitors 530, 532 and first and second switching elements 534, 536. The first capacitor 534 has a first terminal connected to the first predriver 524, and a second terminal connected to the drain terminal of the P-MOSFET 18, which is connected to the output terminal OUT. The second capacitor 532 has a first terminal connected to the second predriver 526, and a second terminal connected to the drain terminal of the N-MOSFET 20, which is connected to the output terminal OUT. The first switching element 534 has a first terminal connected to the first terminal of the first capacitor 530, and a second terminal connected to the power supply. The second switching element 536 has a first terminal connected to the first terminal of the second capacitor 532, and a second terminal connected to ground.

The first predriver 524 includes a P-MOSFET 540 and a pair of N-MOSFETs 542, 544 connected in series. The gate electrodes of these MOSFETs 540, 542, 544 receive a control signal from the control circuit 216. The source terminal of P-MOSFET 540 is connected to the power supply, and the source terminal of N-MOSFET 544 is connected to ground. A first driving signal is output to the gate electrode of the P-MOSFET 18 in the inverter circuit 22 from the node at which the drain terminals of P-MOSFET 540 and N-MOSFET 542 are interconnected. A first auxiliary signal is output to the first terminal of the first capacitor 530 from the node at which the source terminal of N-MOSFET 542 and the drain terminal of N-MOSFET 544 are interconnected.

Similarly, the second predriver 526 includes a pair of P-MOSFETs 546, 548 and an N-MOSFET 550 connected in series. The gate electrodes of these MOSFETs 546, 548, 550 receive another control signal from the control circuit 216. The source terminal of P-MOSFET 546 is connected to the power supply, and the source terminal of N-MOSFET 550 is connected to ground. A second driving signal is output to the gate electrode of the N-MOSFET 20 in the inverter circuit 22 from the node at which the drain terminals of P-MOSFET 548 and N-MOSFET 550 are interconnected. A second auxiliary signal is output to the first terminal of the second capacitor 532 from the node at which the drain terminal of P-MOSFET 546 and the source terminal of P-MOSFET 548 are interconnected.

The first driving signal turns P-MOSFET 18 on and off in response to the control signal received by the first predriver 524 from the control circuit 216. Similarly, the second driving signal turns N-MOSFET 20 on and off in response to the control signal received by the second predriver 526 from the control circuit 216. The first and second driving signals have pulse-like waveforms with abrupt transitions, as in the preceding embodiments.

When the control signals input to the predrivers 524, 526 are low, P-MOSFETs 540, 546, 548 are turned on, N-MOSFETs 542, 544, 550 are turned off, and the switching control circuit 214 turns the first switching element 534 on and the second switching element 536 off. The first and second driving signals and the second auxiliary signal are low and the first auxiliary signal is in the high-impedance state. P-MOSFET 18 is turned off, N-MOSFET 20 is turned on, the output signal of the inverter circuit 22 is low, and the capacitors 530, 532 are charged so that their first terminals are high and their second terminals are low.

When the control signals input to the predrivers 524, 526 are high, P-MOSFETs 540, 546, 548 are turned off, N-MOSFETs 542, 544, 550 are turned on, and the switching control circuit 214 turns the first switching element 534 off and the second switching element 536 on. The first and second driving signals and the first auxiliary signal are low and the second auxiliary signal is in the high-impedance state. P-MOSFET 18 is turned on, N-MOSFET 20 is turned off, the output signal of the inverter circuit 22 is high, and the capacitors 530, 532 are discharged so that their first terminals are low and their second terminals are high.

When the control signal input to the first predriver 524 makes a transition from the low level to the high level, the turn-on of P-MOSFET 18 in the inverter circuit 22 is delayed because its gate electrode is connected through N-MOSFET 542 to the first capacitor 530, and the first predriver 524 must discharge the first capacitor 530 as well as the gate capacitance of P-MOSFET 18.

When the control signal input to the first predriver 524 makes a transition from the high level to the low level, however, the P-MOSFET 18 in the inverter circuit 22 turns off at once because its gate electrode is connected through P-MOSFET 540 to the power supply, and is disconnected from the first capacitor 530. The first capacitor 532 charges from the power supply through the first switching element 534.

Similarly, when the control signal input to the second predriver 526 makes a transition from the low level to the high level, the N-MOSFET 20 in the inverter circuit 22 turns off at once because its gate electrode is connected through N-MOS- FET 550 to ground, and is disconnected from the second capacitor 532. The first capacitor 532 discharges through the second switching element 536 to ground.

When the control signal input to the second predriver 526 makes a transition from the high level to the low level, however, the turn-on of N-MOSFET 20 in the inverter circuit 22 is delayed because its gate electrode is connected through P-MOSFET 548 to the second capacitor 532, and the second predriver 526 must charge the second capacitor 532 as well as the gate capacitance of N-MOSFET 20.

In the semiconductor device in the fifth embodiment, accordingly, the MOSFETs 18, 20 in the inverter 22 turn on slowly, which reduces electromagnetic interference by causing the inverter output waveform to make slow transitions, but turn off quickly, which enables high-speed on/off switching of the output.

In addition, the capacitors 530, 532 operate with a high-low mirror effect that reduces the necessary capacitance values and the necessary size of the capacitors.

Sixth Embodiment

The sixth embodiment differs from the fifth embodiment in that the high-side field-effect transistor is an N-MOSFET, the high-side predriver is differently structured, and the connections of the first capacitor and first switching element are interchanged.

Figure 12:
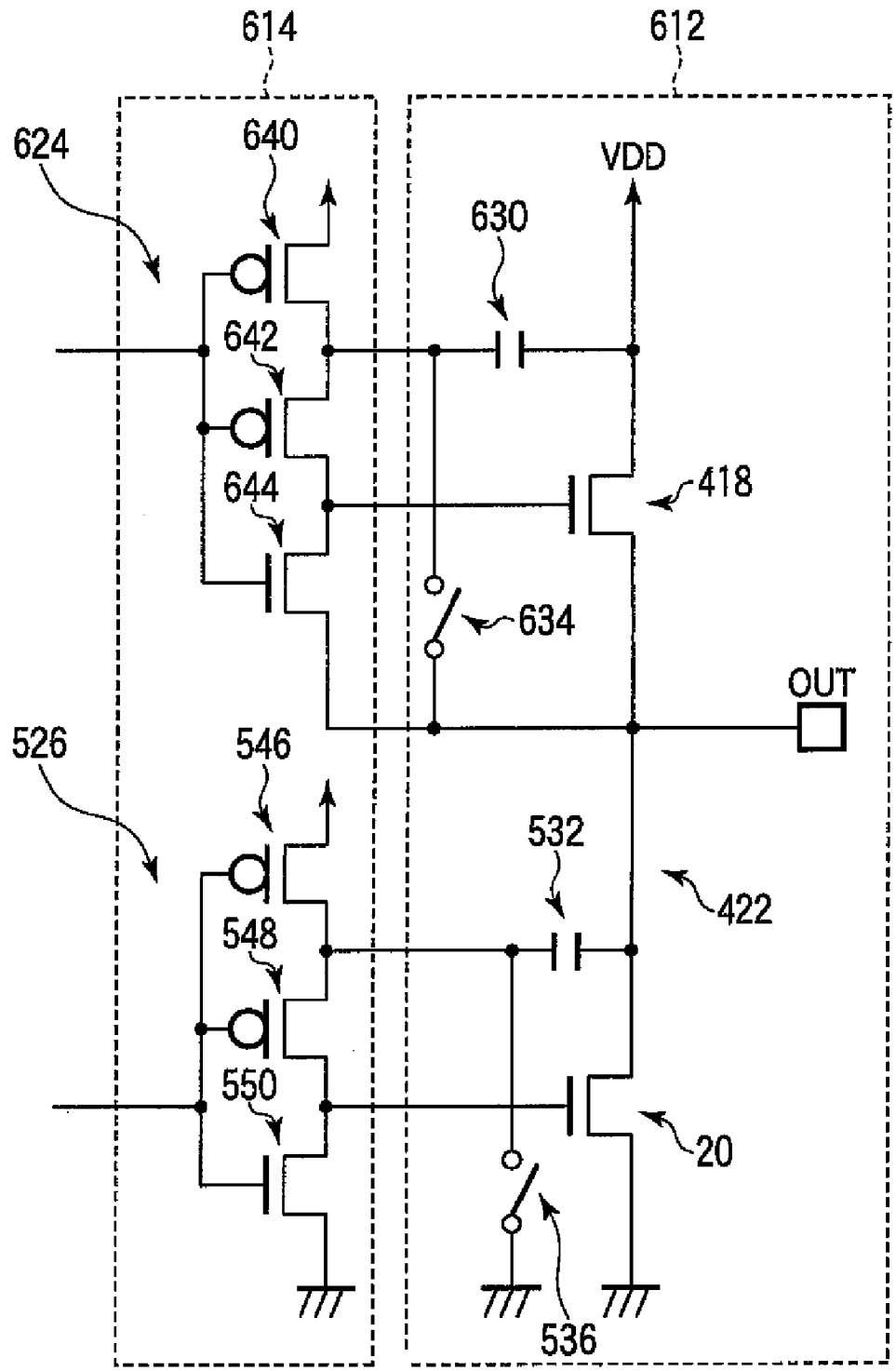
FIG. 12 is a circuit diagram of the predriver circuit and class-D amplifier circuit in a sixth embodiment.

Referring to FIG. 12, the class-D amplifier circuit 612 in the sixth embodiment includes a high-side N-MOSFET 418 connected in series with a low-side N-MOSFET 20 to form a series circuit 422. The gate electrode of the high-side N-MOSFET 418 is connected to the output terminal of a first predriver 624 in the predriver circuit 614.

The class-D amplifier circuit 612 includes first and second capacitors 630, 532 and first and second switching elements 634, 536. The first capacitor 630 has a first terminal connected to the first predriver 624, and a second terminal connected to the drain terminal of the high-side N-MOSFET 418, which is connected to the power supply VDD. The first switching element 634 has a first terminal connected to the first terminal of the first capacitor 630, and a second terminal connected to the source terminal of the high-side N-MOSFET 418, the drain terminal of the low-side N-MOSFET 20, and the output terminal OUT. The second capacitor 532 and second switching element 536 are connected as described in the fifth embodiment.

The first predriver 624 includes a pair of P-MOSFETs 640, 642 and an N-MOSFET 644 connected in series. The gate electrodes of these MOSFETs 640, 642, 644 receive a control signal from the control circuit 216. The source terminal of the P-MOSFET 640 is connected to the power supply, and the source terminal of the N-MOSFET 644 is connected to the output terminal OUT. A first driving signal is output to the gate electrode of the high-side N-MOSFET 418 in the series circuit 422 from the node at which the drain terminals of P-MOSFET 642 and N-MOSFET 644 are interconnected. A first auxiliary signal is output to the first terminal of the first capacitor 630 from the node at which the source terminal of P-MOSFET 640 and the drain terminal of P-MOSFET 642 are interconnected.

The predriver circuit 614 also includes a second predriver 526 as described in the fifth embodiment.

When the control signal input to the first predriver 624 goes low, P-MOSFETs 640 and 642 are turned on, N-MOSFET 644 is turned off, and the first driving signal and first auxiliary signal go high. The switching control circuit 214 turns off the first switching element 634.

The high first driving signal turns on the high-side N-MOSFET 418 in the series circuit 422, but the turn-on of the high-side N-MOSFET 418 is delayed because its gate electrode is connected through P-MOSFET 642 to the second terminal of the first capacitor 630, and the first predriver 524 must charge the first capacitor 630 as well as the gate capacitance of N-MOSFET 418.

When the control signal input to the first predriver 624 goes high, P-MOSFETs 640 and 642 are turned off, N-MOSFET 644 is turned on, the first auxiliary signal is in the high impedance state, and the first driving signal goes to the level of the output terminal OUT. The switching control circuit 214 turns on the first switching element 634, connecting the second terminal of the first capacitor 630 to the output terminal OUT. The high-side N-MOSFET 418 in the series circuit 422 turns off at once because its source and gate are interconnected through N-MOSFET 644, and its gate electrode is disconnected from the first capacitor 630.

The second predriver 526, low-side N-MOSFET 20, and second switching element 536 operate as described in the fifth embodiment, but the control circuit 216 supplies control signals of opposite polarity to the first and second predrivers 624, 526. When the control signal input to the first predriver 624 goes high to turn off the high-side N-MOSFET 418, the control signal input to the second predriver 526 goes low to turn on the low-side N-MOSFET 20, pulling the output signal of the series circuit 422 down to the ground level. Since the first switching element 634 is switched on, the first capacitor 630 discharges to ground. The gate electrode of the high-side N-MOSFET 418 is also pulled down to the ground level.

Since both N-MOSFETs 20, 418 in the series circuit 422 turn on slowly and turn off quickly, the sixth embodiment provides effects similar to the effects of the fifth embodiment in combining low electromagnetic interference with high-speed on/off switching.

Seventh Embodiment

The seventh embodiment differs from the first embodiment in that each field-effect transistor has a separate predriver and no salicide block areas are formed.

Figure 13:
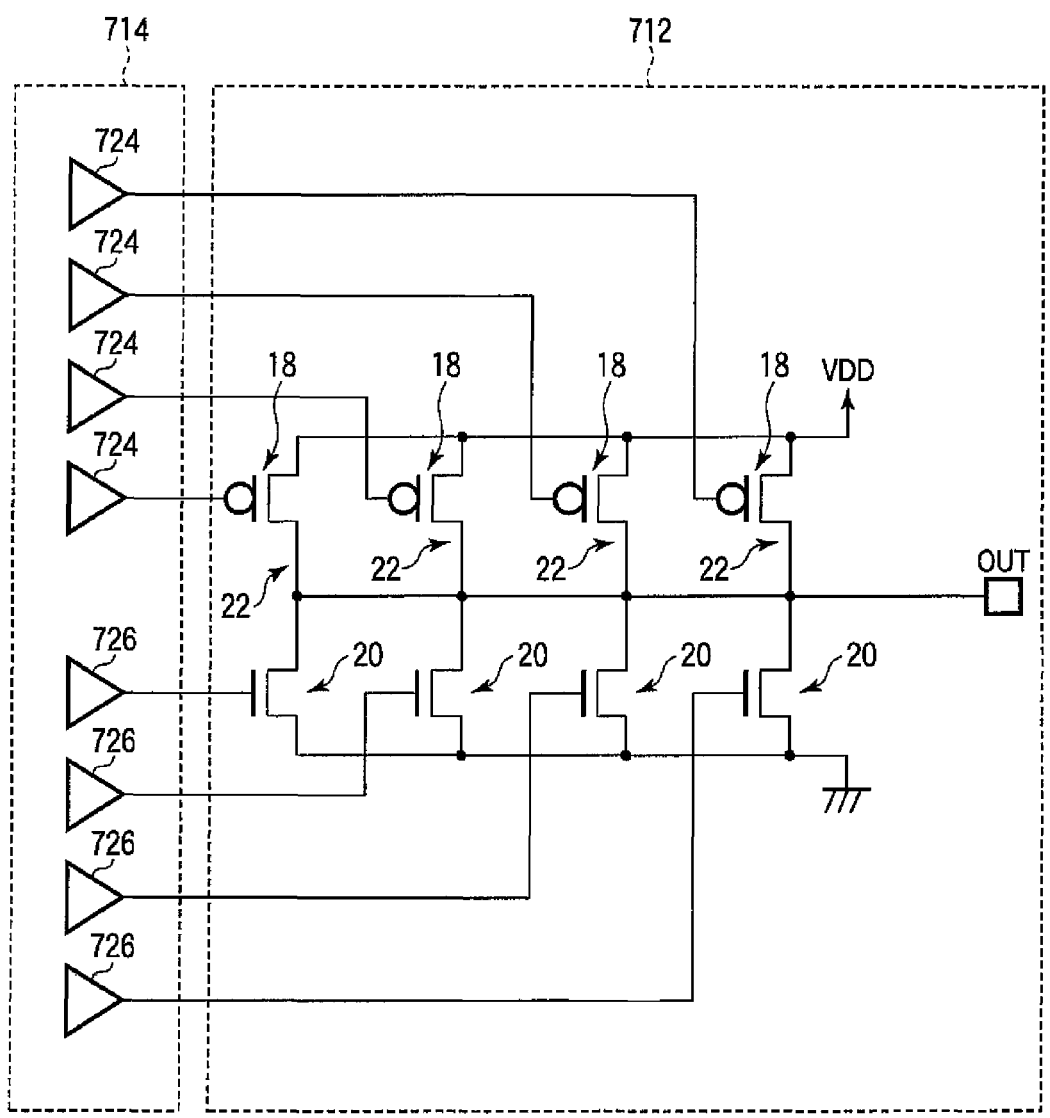
FIG. 13 is a circuit diagram of the predriver circuit and class-D amplifier circuit in a seventh embodiment.

Referring to FIG. 13, the class-D amplifier circuit 712 in the seventh embodiment includes a plurality of series circuits, more specifically inverter circuits 22 comprising respective P-MOSFETs 18 and N-MOSFETs 20 with drain terminals connected to the output terminal OUT. The P-MOSFETs 18 have mutually differing turn-on threshold voltages. Similarly, the N-MOSFETs 20 have mutually differing turn-on threshold voltages. Methods of forming MOSFETs with different threshold voltages are well known.

The predriver circuit 714 includes a plurality of predrivers 724 that output respective first driving signals to the P-MOSFETs 18, and a plurality of predrivers 726 that output respective second driving signal to the N-MOSFETs 20.

The semiconductor device also includes a control circuit 16 as in the first embodiment (FIG. 1).

The gate electrodes of the P-MOSFETs 18 in the inverter circuits 22 are not mutually interconnected; each gate electrode is connected to the output terminal of one of the predrivers 724. Similarly, the gate electrodes of the N-MOSFETs 20 are not mutually interconnected; each gate electrode is connected to the output terminal of one of the predrivers 726.

The high-side predrivers 724 have mutually identical driving ability. Similarly, the low-side predrivers 726 have mutually identical driving ability. The driving signals output by the predrivers 724, 726 have pulse-like waveforms with abrupt transitions.

Starting from a state in which the driving signals are all high, the P-MOSFETs 18 are turned off, the N-MOSFETs 20 are turned on, and the output signal is at the ground level, the seventh embodiment operates as follows.

First, the control circuit 16 outputs a control signal that sends the driving signals to the low level. As the first driving signals from predrivers 724 go low, the P-MOSFETs 18 in the inverter circuits 22 turn on sequentially, at different timings, because of their different threshold voltages. Similarly, as the second driving signals from predrivers 726 go low, the N-MOSFETs 20 in the inverter circuits 22 turn off sequentially, at different timings, because of their different threshold voltages.

As the P-MOSFETs 18 turn on sequentially, they supply an increasing amount of current from the power supply (VDD), and as the N-MOSFETs 20 turn off sequentially, this current is increasingly directed to the output terminal OUT instead of being shunted to ground. As a result, the output signal rises gradually from the ground level to the VDD level.

Similarly, when the driving signals output from the predrivers 724, 726 go high, the P-MOSFETs 18 turn off sequentially, the N-MOSFETs 20 turn on sequentially, and the output terminal OUT is gradually disconnected from the power supply and connected to ground, causing the output signal to fall gradually from the VDD level to the ground level.

The semiconductor device in the seventh embodiment reduces electromagnetic interference by causing the output waveform to make slow transitions, but has a simple circuit configuration, not requiring complex predriver control.

Like the first embodiment, the seventh embodiment can be modified by replacing the P-MOSFETs with N-MOSFETs, so that the class-D amplifier circuit includes a plurality of series circuits, each including a pair of N-MOSFETs connected in series. The predriver circuit may then include a bootstrap circuit to supply a gate voltage for the N-MOSFETs on the high side.

Eighth Embodiment

The eighth embodiment differs from the seventh embodiment in that the gate electrodes of the field-effect transistors are also connected to the power supply or to ground through switching elements.

Figure 14:
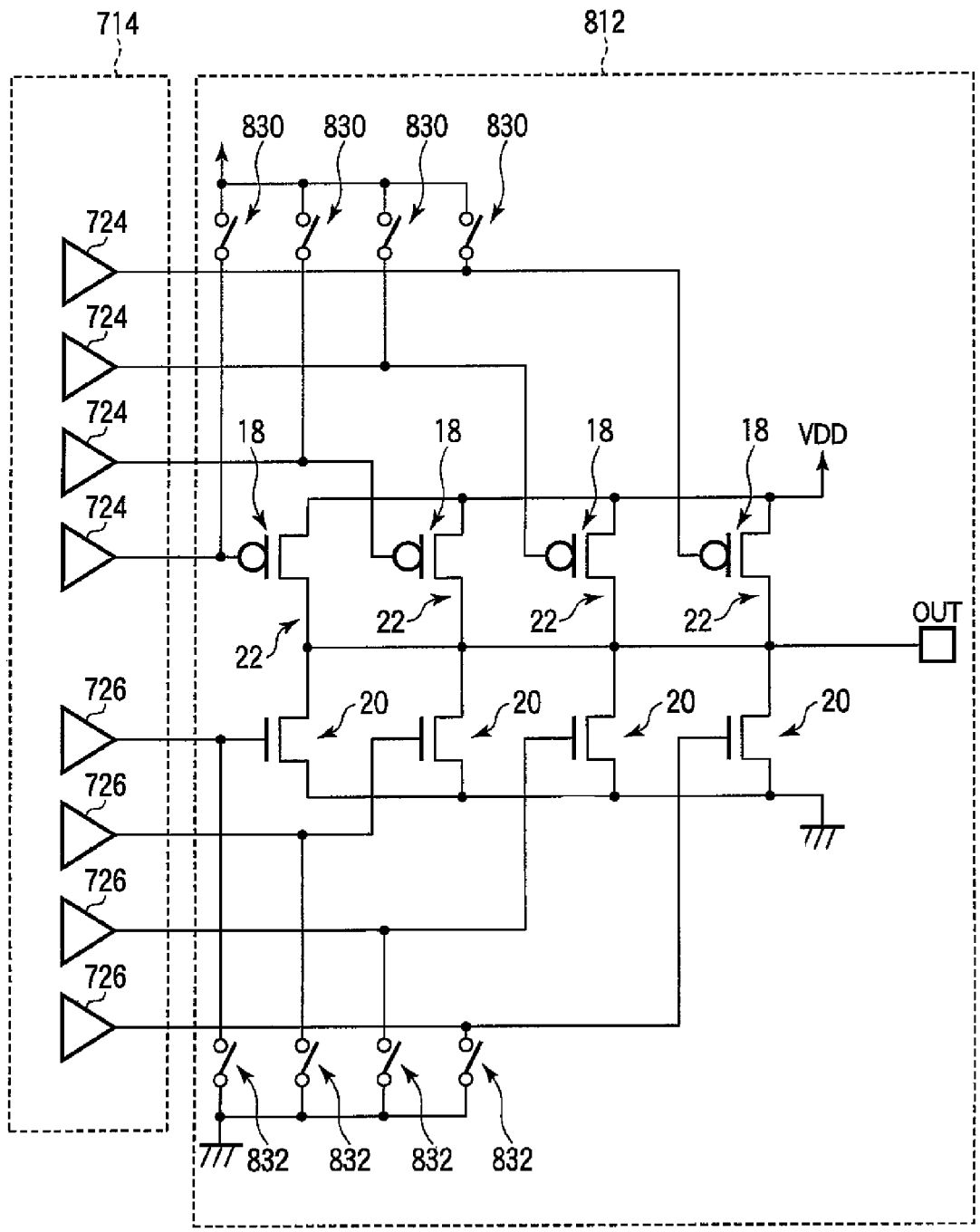
FIG. 14 is a circuit diagram of the predriver circuit and class-D amplifier circuit in an eighth embodiment.

Referring to FIG. 14, the class-D amplifier circuit 812 in the semiconductor device in the eighth embodiment includes a plurality of inverter circuits 22, each having a P-MOSFET 18 and an N-MOSFET 20 connected as in the seventh embodiment. The class-D amplifier circuit 812 also includes a plurality of first switching elements 830 and a plurality of second switching elements 832. Each first switching element 830 has a first terminals connected to the gate of one of the P-MOSFETs 18, and a second terminal connected to the power supply. Each second switching element 832 has a first terminal connected to the gate electrode of one of the N-MOSFETs 20 and a second terminal connected to ground.

The predriver circuit 714 in the eighth embodiment is the same as in the seventh embodiment, but the control circuit in the eighth embodiment is similar to the control circuit 216 in the second embodiment in that it controls the predrivers 724, 726 so that the P-MOSFETs 18 are not turned on until all the N-MOSFETs 20 have been turned off, and the N-MOSFETs 20 are not turned on until all of the P-MOSFETs 18 have been turned off. This prevents current from flowing from the power supply VDD to ground through the N-MOSFETs 418 and N-MOSFETs 20.

The eighth embodiment also includes a switching control circuit similar to the switching control circuit 214 in the third embodiment, that turns all the first switching elements 830 off when the P-MOSFETs 18 are turned on, and turns all the first switching elements 830 on when the P-MOSFETs 18 are turned off. As a result, the P-MOSFETs 18 turn on sequentially because of their different threshold voltages, but turn off promptly, in unison, because their gate electrodes receive the power supply voltage through the first switching elements 830.

The second switching elements 832 are controlled in a similar manner, so that they are turned off when the N-MOSFETs 20 are turned on and are turned on when the N-MOSFETs are turned off. As a result, the N-MOSFETs 20 also turn on sequentially, but turn off promptly in unison.

Other aspects of the structure and operation of the eighth embodiment are as described in the seventh embodiment. Further description will be omitted.

The eighth embodiment provides the same effect as the seventh embodiment in reducing electromagnetic interference by causing the P-MOSFETs 18 or N-MOSFETs 20 to turn on sequentially, and substantially the same effect as the third embodiment in enabling high-speed on/off switching by causing the P-MOSFETs 18 or N-MOSFETs 20 to turn off promptly in unison.

Ninth Embodiment

The ninth embodiment differs from the eighth embodiment in that the high-side field-effect transistors are N-MOSFETs.

Figure 15:
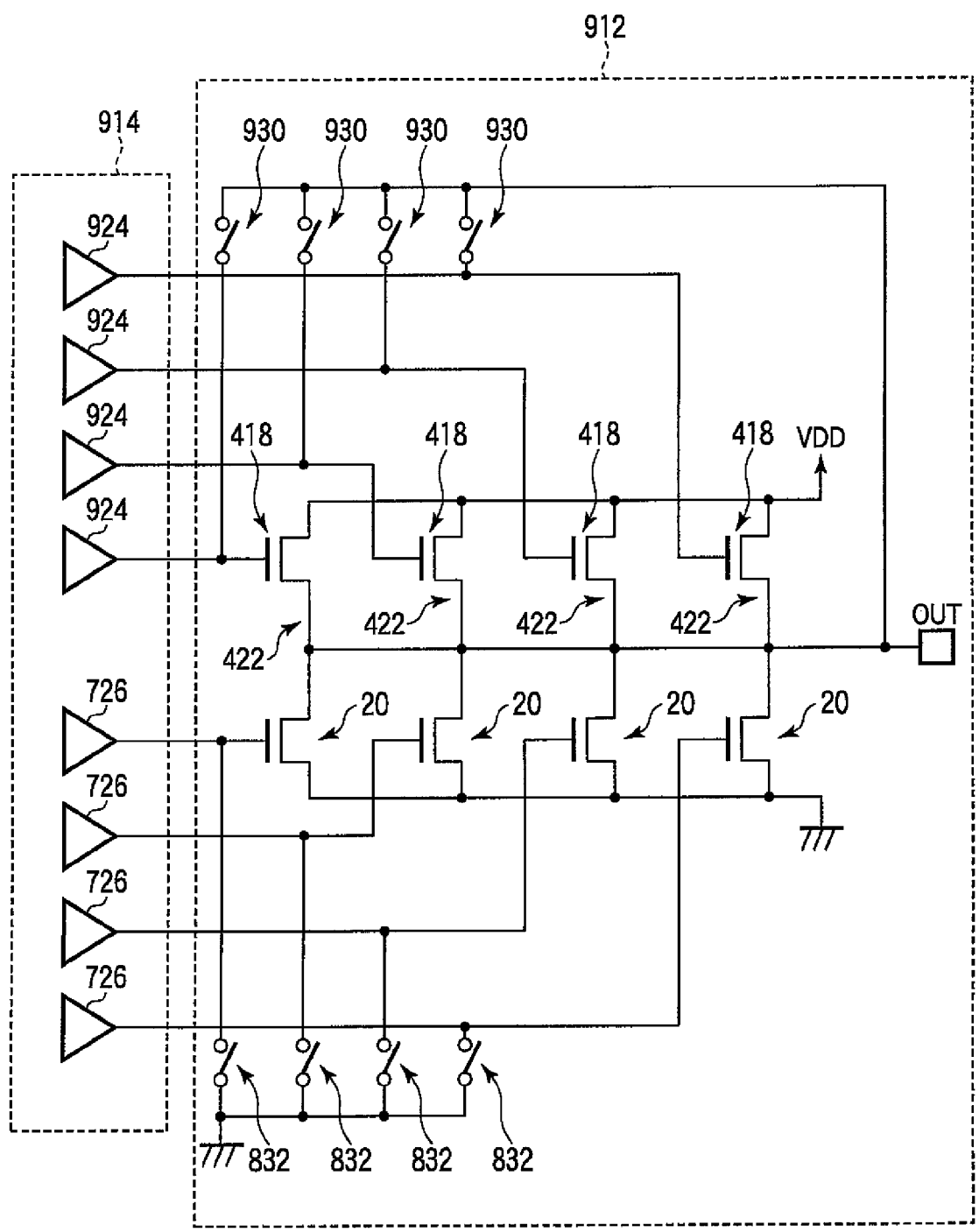
FIG. 15 is a circuit diagram of the predriver circuit and class-D amplifier circuit in a ninth embodiment.

Referring to FIG. 15, the class-D amplifier circuit 912 of the semiconductor device in the ninth embodiment includes a plurality of series circuits 422, each having a high-side N-MOSFET 418 connected in series with a low-side N-MOSFET 20 as in the fourth embodiment. The gate electrodes of the high-side N-MOSFETs 418 are connected to the output terminals of respective predrivers 924 in a predriver circuit 914. The gate electrodes of the low-side N-MOSFETs 20 are connected to the respective output terminals of respective predrivers 726 in the predriver circuit 914.

The high-side N-MOSFETs 418 have mutually differing threshold voltages. Similarly, the low-side N-MOSFETs 20 have mutually differing threshold voltages.

The class-D amplifier circuit 912 also includes a plurality of first switching elements 930 and a plurality of second switching elements 832. Each first switching element 930 has a first terminal connected to the gate electrode of one of the high-side N-MOSFETs 418, and a second terminal connected to the output terminal OUT, the drain terminals of the low-side N-MOSFETs 20, and the source terminals of the high-side N-MOSFETs 418. The second switching elements 832 are connected as in the eighth embodiment.

The predriver circuit 914 may include a bootstrap circuit (not shown) that generates a gate voltage for the high-side N-MOSFETs 418, as in the fourth embodiment.

The predriver circuit 914 is controlled so that it does not turn on the high-side N-MOSFETs 418 until all the low-side N-MOSFETs 20 have been turned off, and does not turn on the low-side N-MOSFETs 20 until all of the high-side N-MOSFETs 418 have been turned off. This prevents current from flowing directly from the power supply VDD to ground through the N-MOSFETs 20 and 418.

The semiconductor device in the eighth embodiment also includes a switching control circuit (not shown) that turns all the first switching elements 930 off when the high-side N-MOSFETs 418 are turned on, and on when the high-side N-MOSFETs 418 are turned off. As a result, the high-side N-MOSFETs 418 turn on at mutually differing timings because of their different threshold voltages, but turn off promptly, in unison, because their source and gate electrodes are interconnected through the first switching elements 930.

The second switching elements 832 are controlled as described in the eighth embodiment, so that the low-side N-MOSFETs 20 also turn on at mutually differing timings, but turn off promptly in unison.

Other aspects of the structure and operation of the ninth embodiment are as described in the seventh embodiment, so further description will be omitted.

The ninth embodiment provides the same effects as the eighth embodiment in reducing electromagnetic interference while enabling high-speed on/off switching by causing the N-MOSFETs on one side to turn off promptly in unison, after which the N-MOSFETs on the other side turn on sequentially.

Tenth Embodiment

The tenth embodiment has the same structure as the seventh embodiment but the predrivers have different driving abilities and the transistors have identical threshold voltages.

More precisely, in the tenth embodiment the P-MOSFETs 18 in FIG. 11 have mutually identical threshold voltages. Similarly, the N-MOSFETs 20 have mutually identical threshold voltages.

The high-side predrivers 724 in the predriver circuit 714 have mutually differing driving abilities, however, and the low-side predrivers 726 have mutually differing driving abilities. The differing driving abilities can be produced by, for example, using transistors with different gate widths in different predrivers.

Starting from a state in which the driving signals are all high, the P-MOSFETs 18 are turned off, the N-MOSFETs 20 are turned on, and the output signal is at the ground level, the tenth embodiment operates as follows. First, the control circuit 16 outputs a control signal that changes the outputs of the predrivers 724, 726 in the predriver circuit 714 to the low level. When the driving signals output from predrivers 724 go low, the P-MOSFETs 18 in the inverter circuits 22 of the class-D amplifier circuit 712 turn on at different timings because of the different driving abilities of predrivers 724.

Similarly, when the driving signals output from predrivers 726 go low, the N-MOSFETs 20 in the inverter circuits 22 of the class-D amplifier circuit 712 turn off at different timings because of the different driving abilities of predrivers 726.

The result is the same as in the seventh embodiment. The waveform of the output signal rises gradually from the low level to the high level as the P-MOSFETs 18 sequentially turn on and the N-MOSFETs 20 sequentially turn off, and falls gradually from the high level to the low level as the P-MOSFETs 18 sequentially turn off and the N-MOSFETs 20 sequentially turn on.

Like the semiconductor device in the seventh embodiment, the semiconductor device in the tenth embodiment has a simple circuit configuration, but can reduce electromagnetic interference by causing the output waveform to make slow transitions.

The technique applied in the tenth embodiment, in which the predrivers on each side have different driving abilities and the transistors on each side have the same threshold voltage, may also be applied in the eighth and ninth embodiments.

Those skilled in the art will recognize that further variations are possible within the scope of the invention, which is defined in the appended claims.

What is claimed is:

1. A semiconductor device comprising:
an output terminal;
a plurality of series circuits for producing an output signal at the output terminal, each series circuit including a high-side field-effect transistor and a low-side field-effect transistor with respective first main terminals interconnected at a node connected to the output terminal, the high-side field-effect transistor having a second main terminal for receiving a power supply voltage, the low-side field-effect transistor having a second main terminal for receiving a ground voltage, the high-side and low-side field-effect transistors having respective control terminals by which they are turned on and off;
a driver circuit for outputting a first driving signal to turn the high-side field-effect transistors on and off and a second driving signal to turn the low-side field-effect transistors on and off;
a first salicided signal line for conducting the first driving signal successively to the control terminals of the high-side field-effect transistors, the first salicided signal line having a first salicide block area disposed between the control terminals of each mutually adjacent pair of high-side field-effect transistors; and
a second salicided signal line for conducting the second driving signal successively to the control terminals of the low-side field-effect transistors, the second salicided signal line having a second salicide block area disposed between each mutually adjacent pair of low-side field-effect transistors.

2. The semiconductor device of claim 1, wherein the control terminals of the high-side field-effect transistors extend as stubs from the first salicided signal line, and the control terminals of the low-side field-effect transistors extend as stubs from the second salicided signal line.

3. The semiconductor device of claim 1, wherein the control terminals of the high-side field-effect transistors are in series with each first salicide block area, and the control terminals of the low-side field-effect transistors are in series with each second salicide block area.

4. The semiconductor device of claim 1, further comprising:
a first switching element connected to the first salicided signal line in parallel with each first salicide block area;
a second switching element connected to the second salicided signal line in parallel with each second salicide block area; and
a switching control circuit for turning the first switching element off when the high-side field-effect transistors are turned on, turning the first switching element on when the high-side field-effect transistors are turned off, turning the second switching element off when the low-side field-effect transistors are turned on, and turning the second switching element on when the low-side field-effect transistors are turned off.

5. The semiconductor device of claim 4, wherein there are at least three series circuits, at least two first switching elements, and at least two second switching elements, a programmable number of the first switching elements being left turned on when the high-side field-effect transistors are turned on, another programmable number of the second switching elements being left turned on when the low-side field-effect transistors are turned on.

6. The semiconductor device of claim 1, wherein the high-side field-effect transistors are p-channel metal-oxide-semiconductor field-effect transistors (P-MOSFETs) and the low-side field-effect transistors are n-channel metal-oxidesemiconductor field-effect transistors (N-MOSFETs), further comprising, for each series circuit in the plurality of series circuits except a series circuit closest to the driver circuit:

a first switching element having one terminal for receiving the power supply voltage and another terminal connected to the control terminal of the high-side field-effect transistor in the series circuit; and a second switching element having one terminal for receiving the ground voltage and another terminal connected to the control terminal of the low-side field-effect transistor in the series circuit;

the semiconductor device also comprising a switching control circuit for turning the first switching element off when the high-side field-effect transistors are turned on, turning the first switching element on when the high-side field-effect transistors are turned off, turning the second switching element off when the low-side field-effect transistors are turned on, and turning the second switching element on when the low-side field-effect transistors are turned off.

7. The semiconductor device of claim 1, wherein the high-side field-effect transistors and the low-side field-effect transistors are N-MOSFETs, further comprising, for each series circuit in the plurality of series circuits except a series circuit closest to the driver circuit:

a first switching element having one terminal connected to the output terminal and another terminal connected to the control terminal of the high-side field-effect transistor in the series circuit; and a second switching element having one terminal for receiving the ground voltage and another terminal connected to the control terminal of the low-side field-effect transistor in the series circuit;

the semiconductor device also comprising a switching control circuit for turning the first switching element off when the high-side field-effect transistors are turned on, turning the first switching element on when the high-side field-effect transistors are turned off, turning the second switching element off when the low-side field-effect transistors are turned on, and turning the second switching element on when the low-side field-effect transistors are turned off.

8. A semiconductor device comprising:

an output terminal;

a series circuit for producing an output signal at the output terminal, the series circuit including a high-side field-effect transistor and a low-side field-effect transistor with respective first main terminals interconnected at a node connected to the output terminal, the high-side field-effect transistor having a second main terminal for receiving a power supply voltage, the low-side field-effect transistor having a second main terminal for receiving a ground voltage, the high-side and low-side field-effect transistors having respective control terminals by which they are turned on and off;

a first capacitor having a first terminal and a second terminal;

a second capacitor having a first terminal and a second terminal;

a first switching element connected to the first terminal of the first capacitor;

a second switching element connected to the first terminal of the second capacitor;

a switching control circuit for controlling the first and second switching elements;

a first driver for outputting a first driving signal to the control terminal of the high-side field-effect transistor and a first auxiliary signal to the first terminal of the first capacitor; and a second driver for outputting a second driving signal to the control terminal of the low-side field-effect transistor and a second auxiliary signal to the first terminal of the second capacitor; wherein when the high-side field-effect transistor is turned on, the first driver sets the first driving signal and the first auxiliary signal to mutually identical levels and the switching control circuit turns the first switching element off;

when the high-side field-effect transistor is turned off, the first driver places the first auxiliary signal in a high-impedance state and the switching control circuit turns the first switching element on;

when the low-side field-effect transistor is turned on, the second driver sets the second driving signal and the second auxiliary signal to mutually identical levels and the switching control circuit turns the second switching element off; and when the high-side field-effect transistor is turned off, the second driver places the second auxiliary signal in the high-impedance state and the switching control circuit turns the second switching element on.

9. The semiconductor device of claim 8, wherein:

the low-side field-effect transistor is a first N-MOSFET;

the second switching element has a first terminal connected to the first terminal of the second capacitor and a second terminal for receiving the ground voltage; and the second driver further comprises a first P-MOSFET, a second P-MOSFET, and a second N-MOSFET connected in series, the first P-MOSFET having a main terminal for receiving the power supply voltage, the second N-MOSFET having a main terminal for receiving the ground voltage, the second auxiliary signal being output from a node at which the first P-MOSFET and the second P-MOSFET are interconnected, the second driving signal being output from a node at which the second P-MOSFET and the second N-MOSFET are interconnected.

10. The semiconductor device of claim 9, wherein:

the high-side field-effect transistor is a third P-MOSFET;

the first switching element has a first terminal connected to the first terminal of the first capacitor and a second terminal for receiving the power supply voltage; and the first driver further comprises a fourth P-MOSFET, a third N-MOSFET, and a fourth N-MOSFET connected in series, the fourth P-MOSFET having a main terminal for receiving the power supply voltage, the fourth N-MOSFET having a main terminal for receiving the ground voltage, the first driving signal being output from a node at which the fourth P-MOSFET and the third N-MOSFET are interconnected, the first auxiliary signal being output from a node at which the third N-MOSFET and the fourth N-MOSFET are interconnected.

11. The semiconductor device of claim 9, wherein:

the high-side field-effect transistor is a third N-MOSFET;

the first switching element has a first terminal connected to the first terminal of the first capacitor and a second terminal connected to the output terminal; and the first driver further comprises a third P-MOSFET, a fourth P-MOSFET, and a fourth N-MOSFET connected in series, the third P-MOSFET having a main terminal for receiving the power supply voltage, the fourth N-MOSFET having a main terminal for receiving the ground voltage, the first auxiliary signal being output from a node at which the third P-MOSFET and the fourth P-MOSFET are interconnected, the first driving signal being output from a node at which the fourth P-MOSFET and the fourth N-MOSFET are interconnected.

12. A semiconductor device comprising:
an output terminal;
a plurality of series circuits for producing an output signal at the output terminal, each series circuit including a high-side field-effect transistor and a low-side field-effect transistor with respective first main terminals interconnected at a node connected to the output terminal, the high-side field-effect transistor having a second main terminal for receiving a power supply voltage, the low-side field-effect transistor having a second main terminal for receiving a ground voltage, the high-side and low-side field-effect transistors having respective control terminals by which they are turned on and off;
a driver circuit for outputting a plurality of first driving signals to the control terminals of the high-side field-effect transistors and a plurality of second driving signals to the control terminals of the low-side field-effect transistors; wherein
the first driving signals turn the high-side field-effect transistors on at mutually differing timings; and
the second driving signals turn the low-side field-effect transistors on at mutually differing timings,
wherein the high-side field-effect transistors have mutually identical threshold voltages, the low-side field-effect transistors have mutually identical threshold voltages, and the driver circuit further comprises:
a plurality of first drivers with mutually differing driving abilities for generating the first driving signals; and
a plurality of second drivers with mutually differing driving abilities for generating the second driving signals.

13. A semiconductor device comprising:
an output terminal;
a plurality of series circuits for producing an output signal at the output terminal, each series circuit including a high-side field-effect transistor and a low-side field-effect transistor with respective first main terminals interconnected at a node connected to the output terminal, the high-side field-effect transistor having a second main terminal for receiving a power supply voltage, the low-side field-effect transistor having a second main terminal for receiving a ground voltage, the high-side and low-side field-effect transistors having respective control terminals by which they are turned on and off;
a driver circuit for outputting a plurality of first driving signals to the control terminals of the high-side field-effect transistors and a plurality of second driving signals to the control terminals of the low-side field-effect transistors; wherein
the first driving signals turn the high-side field-effect transistors on at mutually differing timings; and
the second driving signals turn the low-side field-effect transistors on at mutually differing timings,
wherein the high-side field-effect transistors are P-MOSFETs and the low-side field-effect transistors are N-MOSFETs, further comprising:
a plurality of first switching elements each having one terminal for receiving the power supply voltage and another terminal connected to the control terminal the high-side field-effect transistor in one of the series circuits;
a plurality of second switching element each having one terminal for receiving the ground voltage and another terminal connected to the control terminal of the low-side field-effect transistor in one of the series circuits; and
a switching control circuit for turning the first switching elements off when the high-side field-effect transistors are turned on, turning the first switching elements on when the high-side field-effect transistors are turned off, turning the second switching elements off when the low-side field-effect transistors are turned on, and turning the second switching elements on when the low-side field-effect transistors are turned off.

14. A semiconductor device comprising:
an output terminal;
a plurality of series circuits for producing an output signal at the output terminal, each series circuit including a high-side field-effect transistor and a low-side field-effect transistor with respective first main terminals interconnected at a node connected to the output terminal, the high-side field-effect transistor having a second main terminal for receiving a power supply voltage, the low-side field-effect transistor having a second main terminal for receiving a ground voltage, the high-side and low-side field-effect transistors having respective control terminals by which they are turned on and off:
a driver circuit for outputting a plurality of first driving signals to the control terminals of the high-side field-effect transistors and a plurality of second driving signals to the control terminals of the low-side field-effect transistors; wherein
the first driving signals turn the high-side field-effect transistors on at mutually differing timings: and
the second driving signals turn the low-side field-effect transistors on at mutually differing timings,
wherein the high-side field-effect transistors and the low-side field-effect transistors are N-MOSFETs, further comprising:
a plurality of first switching elements each having one terminal connected to the output terminal and another terminal connected to the control terminal of the high-side field-effect transistor in one of the series circuits;
a plurality of second switching element each having one terminal for receiving the ground voltage and another terminal connected to the control terminal of the low-side field-effect transistor in one of the series circuits; and
a switching control circuit for turning the first switching elements off when the high-side field-effect transistors are turned on, turning the first switching elements on when the high-side field-effect transistors are turned off, turning the second switching elements off when the low-side field-effect transistors are turned on, and turning the second switching elements on when the low-side field-effect transistors are turned off.

* * * * *